United States Patent
Biquet et al.

(10) Patent No.: US 10,586,685 B2
(45) Date of Patent: Mar. 10, 2020

(54) HOLLOW CATHODE PLASMA SOURCE

(71) Applicants: AGC GLASS EUROPE, S.A., Gosselies (BE); AGC FLAT GLASS NORTH AMERICA, INC., Alpharetta, GA (US); ASAHI GLASS CO., LTD., Tokyo (JP)

(72) Inventors: Thomas Biquet, Gosselies (BE); Peter Maschwitz, Sebastopol, CA (US); John Chambers, San Francisco, CA (US); Hughes Wiame, Gosselies (BE)

(73) Assignees: AGC GLASS EUROPE, Louvain-la Neuve (BE); AGC FLAT GLASS NORTH AMERICA, INC., Alpharetta, GA (US); ASAHI GLASS CO., LTD., Tokyo (JP)

( * ) Notice: Subject to any disclaimer, the term of this patent is extended or adjusted under 35 U.S.C. 154(b) by 0 days.

(21) Appl. No.: 15/532,855

(22) PCT Filed: Dec. 5, 2014

(86) PCT No.: PCT/US2014/068858
§ 371 (c)(1),
(2) Date: Jun. 2, 2017

(87) PCT Pub. No.: WO2016/089424
PCT Pub. Date: Jun. 9, 2016

(65) Prior Publication Data
US 2018/0025892 A1    Jan. 25, 2018

(51) Int. Cl.
*C23C 16/00* (2006.01)
*H01L 21/00* (2006.01)
(Continued)

(52) U.S. Cl.
CPC ...... *H01J 37/32541* (2013.01); *C23C 16/455* (2013.01); *C23C 16/50* (2013.01);
(Continued)

(58) Field of Classification Search
CPC .................................................. H01J 37/32596
See application file for complete search history.

(56) References Cited

U.S. PATENT DOCUMENTS

| 2,920,235 A | 1/1960 | Bell et al. |
| 3,253,180 A | 5/1966 | Huber |

(Continued)

FOREIGN PATENT DOCUMENTS

| CN | 1598049 A | 3/2005 |
| CN | 1831190 A | 9/2006 |

(Continued)

OTHER PUBLICATIONS

Office Action issued for Chinese Patent Application No. 201510505383.2 dated Feb. 1, 2018, along with English translation (4 pages).
(Continued)

*Primary Examiner* — Sylvia MacArthur
*Assistant Examiner* — Michelle Crowell
(74) *Attorney, Agent, or Firm* — Rothwell, Figg, Ernst & Manbeck, P.C.

(57) ABSTRACT

The present invention relates to a hollow cathode plasma source and to methods for surface treating or coating using such a plasma source, comprising first and second electrodes (1, 2), each electrode comprising an elongated cavity (4), wherein dimensions for at least one of the following parameters is selected so as to ensure high electron density and/or low amount of sputtering of plasma source cavity surfaces, those parameters being cavity cross section shape, cavity cross section area cavity distance (11), and outlet nozzle width (12).

7 Claims, 5 Drawing Sheets

(51) Int. Cl.
*H01J 37/32* (2006.01)
*H05H 1/46* (2006.01)
*C23C 16/455* (2006.01)
*C23C 16/50* (2006.01)
*H05H 1/48* (2006.01)

(52) U.S. Cl.
CPC .... *H01J 37/3244* (2013.01); *H01J 37/32568* (2013.01); *H01J 37/32596* (2013.01); *H05H 1/46* (2013.01); *H05H 1/48* (2013.01); *H01J 2237/3321* (2013.01); *H01J 2237/3325* (2013.01); *H05H 2001/466* (2013.01); *H05H 2240/10* (2013.01); *H05H 2245/1235* (2013.01)

(56) References Cited

U.S. PATENT DOCUMENTS

| | | | |
|---|---|---|---|
| 3,381,157 A | 4/1968 | Ferreira | |
| 3,813,549 A | 5/1974 | Di Stefano et al. | |
| 4,017,808 A | 4/1977 | Fein et al. | |
| 4,196,233 A | 4/1980 | Bitzer et al. | |
| 4,419,203 A | 12/1983 | Harper et al. | |
| 4,422,014 A | 12/1983 | Glaser | |
| 4,702,784 A | 10/1987 | Naoumidis et al. | |
| 4,916,356 A | 4/1990 | Ahern et al. | |
| 5,028,791 A | 7/1991 | Koshiishi et al. | |
| 5,070,811 A | 12/1991 | Feuerstein et al. | |
| 5,113,790 A | 5/1992 | Geisler et al. | |
| 5,185,132 A | 2/1993 | Horiike et al. | |
| 5,286,534 A | 2/1994 | Kohler et al. | |
| 5,302,422 A | 4/1994 | Nowak et al. | |
| 5,369,337 A | 11/1994 | Yanagi et al. | |
| 5,399,254 A | 3/1995 | Geisler et al. | |
| 5,437,778 A | 8/1995 | Hedgcoth | |
| 5,581,155 A | 12/1996 | Morozov et al. | |
| 5,593,539 A | 1/1997 | Kubota et al. | |
| 5,609,690 A | 3/1997 | Watanabe et al. | |
| 5,614,248 A | 3/1997 | Schiller et al. | |
| 5,614,273 A | 3/1997 | Goedicke et al. | |
| 5,627,435 A | 5/1997 | Jansen et al. | |
| 5,846,608 A | 12/1998 | Neumann et al. | |
| 5,874,807 A | 2/1999 | Neger et al. | |
| 5,908,602 A | 6/1999 | Bardoes et al. | |
| 5,939,829 A | 8/1999 | Schoenbach et al. | |
| 5,985,378 A | 11/1999 | Paquet | |
| 6,082,293 A | 7/2000 | Kawashima | |
| 6,140,773 A | 10/2000 | Anders et al. | |
| 6,146,462 A | 11/2000 | Yializis et al. | |
| 6,174,450 B1 | 1/2001 | Patrick et al. | |
| 6,177,148 B1 | 1/2001 | Walther et al. | |
| 6,293,222 B1 | 6/2001 | Paquet | |
| 6,388,381 B2 | 5/2002 | Anders | |
| 6,444,945 B1 * | 9/2002 | Maschwitz | C23C 14/243 118/723 E |
| 6,489,854 B1 | 12/2002 | Chen | |
| 6,508,911 B1 | 1/2003 | Han et al. | |
| 6,528,947 B1 | 3/2003 | Chen et al. | |
| 6,750,600 B2 | 6/2004 | Kaufman et al. | |
| 6,768,079 B2 | 7/2004 | Kosakai | |
| 6,800,336 B1 | 10/2004 | Fornsel et al. | |
| 6,849,854 B2 | 2/2005 | Sainty | |
| 6,899,054 B1 | 5/2005 | Bardos et al. | |
| 6,902,814 B2 | 6/2005 | Takahashi et al. | |
| 6,924,223 B2 | 8/2005 | Yamasaki et al. | |
| 7,241,360 B2 | 7/2007 | Shabalin et al. | |
| 7,307,383 B2 | 12/2007 | Takeuchi et al. | |
| 7,322,313 B2 | 1/2008 | Mayumi et al. | |
| 7,327,089 B2 | 2/2008 | Madocks | |
| 7,411,352 B2 | 8/2008 | Madocks | |
| 7,411,353 B1 | 8/2008 | Rutberg et al. | |
| 7,543,546 B2 | 6/2009 | Shibata et al. | |
| 7,649,316 B2 | 1/2010 | Rueger et al. | |
| 7,976,907 B2 | 7/2011 | Hofrichter et al. | |
| 8,143,788 B2 | 3/2012 | Hofer et al. | |
| 8,328,982 B1 * | 12/2012 | Babayan | C23F 4/00 118/715 |
| 8,356,575 B2 | 1/2013 | Sasaki et al. | |
| 8,476,587 B2 | 7/2013 | Jones et al. | |
| 8,652,586 B2 | 2/2014 | Maschwitz | |
| 8,697,197 B2 | 4/2014 | Savas et al. | |
| 8,926,920 B2 | 1/2015 | Morfill et al. | |
| 9,533,914 B2 | 1/2017 | Mahieu et al. | |
| 9,704,692 B2 | 7/2017 | Lesser | |
| 9,721,765 B2 | 8/2017 | Chambers et al. | |
| 9,735,020 B2 | 8/2017 | Hudson | |
| 10,068,743 B2 | 9/2018 | Goerbing | |
| 2002/0000779 A1 | 1/2002 | Anders | |
| 2002/0194833 A1 | 12/2002 | Gallimore et al. | |
| 2003/0113479 A1 | 6/2003 | Fukuda et al. | |
| 2004/0033385 A1 | 2/2004 | Kaushal et al. | |
| 2005/0016456 A1 | 1/2005 | Taguchi et al. | |
| 2005/0016458 A1 | 1/2005 | Zhang et al. | |
| 2005/0035731 A1 | 2/2005 | Secheresse et al. | |
| 2005/0040037 A1 | 2/2005 | Walton et al. | |
| 2005/0106094 A1 | 5/2005 | Kondo | |
| 2005/0115933 A1 | 6/2005 | Kong et al. | |
| 2005/0208215 A1 | 9/2005 | Eguchi et al. | |
| 2005/0221022 A1 | 10/2005 | Wang et al. | |
| 2006/0030134 A1 | 2/2006 | Kim et al. | |
| 2006/0177599 A1 | 8/2006 | Madocks | |
| 2006/0208649 A1 | 9/2006 | Rueger et al. | |
| 2007/0002515 A1 | 1/2007 | Hino et al. | |
| 2007/0017636 A1 | 1/2007 | Goto et al. | |
| 2007/0123041 A1 | 5/2007 | Anzai et al. | |
| 2007/0144621 A1 | 6/2007 | Farmer et al. | |
| 2007/0163440 A1 | 7/2007 | Kim et al. | |
| 2008/0073557 A1 | 3/2008 | German et al. | |
| 2008/0106202 A1 | 5/2008 | Du et al. | |
| 2009/0004836 A1 | 1/2009 | Singh et al. | |
| 2009/0032393 A1 | 2/2009 | Madocks | |
| 2009/0071403 A1 | 3/2009 | Choi et al. | |
| 2009/0071406 A1 | 3/2009 | Choi et al. | |
| 2009/0183771 A1 | 7/2009 | Sannomiya et al. | |
| 2009/0218212 A1 | 9/2009 | Denpoh et al. | |
| 2010/0028238 A1 | 2/2010 | Maschwitz | |
| 2010/0044579 A1 | 2/2010 | Holmes et al. | |
| 2010/0126779 A1 | 5/2010 | Corbett et al. | |
| 2010/0186671 A1 | 7/2010 | Hein et al. | |
| 2010/0225234 A1 | 9/2010 | Tseng et al. | |
| 2011/0005682 A1 | 1/2011 | Savas et al. | |
| 2011/0006040 A1 | 1/2011 | Savas et al. | |
| 2011/0135843 A1 | 6/2011 | Niira et al. | |
| 2011/0192348 A1 | 8/2011 | Tseng et al. | |
| 2011/0212624 A1 | 9/2011 | Hudson | |
| 2011/0226611 A1 | 9/2011 | Madocks | |
| 2011/0297532 A1 | 12/2011 | Chakraborty et al. | |
| 2012/0019946 A1 | 1/2012 | Aravind | |
| 2012/0164353 A1 | 6/2012 | Madocks | |
| 2012/0225218 A1 * | 9/2012 | Savas | C23C 16/45574 427/576 |
| 2012/0258555 A1 * | 10/2012 | Holland | H01J 37/32596 438/5 |
| 2012/0289054 A1 | 11/2012 | Holland et al. | |
| 2012/0313517 A1 | 12/2012 | Rueger et al. | |
| 2013/0112670 A1 | 5/2013 | Yokogawa et al. | |
| 2013/0333618 A1 * | 12/2013 | Cox | C23C 16/52 118/723 FI |
| 2013/0337657 A1 | 12/2013 | Savas et al. | |
| 2014/0099451 A1 | 4/2014 | Mahieu et al. | |
| 2014/0216343 A1 | 8/2014 | Maschwitz | |
| 2014/0220361 A1 | 8/2014 | Maschwitz | |
| 2014/0272388 A1 | 9/2014 | Knight et al. | |
| 2014/0272459 A1 | 9/2014 | Daugherty et al. | |
| 2014/0354119 A1 | 12/2014 | Shishido et al. | |
| 2014/0354149 A1 | 12/2014 | Morgner et al. | |
| 2015/0002021 A1 | 1/2015 | Maschwitz | |
| 2015/0004330 A1 | 1/2015 | Maschwitz | |
| 2015/0152542 A1 | 6/2015 | Deppisch et al. | |
| 2015/0235814 A1 | 8/2015 | Kawahara et al. | |
| 2016/0024657 A1 * | 1/2016 | Sakamoto | C23C 16/509 427/489 |

(56) References Cited

U.S. PATENT DOCUMENTS

| | | | |
|---|---|---|---|
| 2017/0004955 | A1 | 1/2017 | Lesser |
| 2017/0040145 | A1 | 2/2017 | Brandon et al. |
| 2017/0178869 | A1 | 6/2017 | Chambers et al. |

FOREIGN PATENT DOCUMENTS

| | | | |
|---|---|---|---|
| CN | 1860587 | A | 11/2006 |
| CN | 102099505 | A | 6/2011 |
| CN | 102497721 | A | 6/2012 |
| CN | 102677022 | A | 9/2012 |
| CN | 102771192 | A | 11/2012 |
| CN | 102816987 | A | 12/2012 |
| CN | 103042317 | A | 4/2013 |
| CN | 103493602 | A | 1/2014 |
| CN | 103534383 | A | 1/2014 |
| CN | 103632911 | A | 3/2014 |
| CN | 105427014 | A | 3/2016 |
| DE | 199 02 146 | A1 | 8/2000 |
| EA | 201391765 | A1 | 4/2014 |
| EP | 0727508 | A1 | 8/1996 |
| EP | 0881865 | A2 | 12/1998 |
| EP | 0886310 | A2 | 12/1998 |
| EP | 1035561 | A2 | 9/2000 |
| EP | 1913624 | A1 | 4/2008 |
| GB | 1 257 015 | A | 12/1971 |
| JP | S-59228338 | A | 12/1984 |
| JP | S61-238962 | A | 10/1986 |
| JP | 61251021 | A | 11/1986 |
| JP | S63-297560 | A | 12/1988 |
| JP | H4-180557 | A | 6/1992 |
| JP | H4-358076 | A | 12/1992 |
| JP | H5-226258 | A | 9/1993 |
| JP | H7-73994 | A | 3/1995 |
| JP | 3061288 | U | 6/1999 |
| JP | H11-335868 | A | 12/1999 |
| JP | 2001035692 | A | 2/2001 |
| JP | 2002-121670 | A | 4/2002 |
| JP | 2002-143795 | A | 5/2002 |
| JP | 2003-193239 | A | 7/2003 |
| JP | 2004-533703 | A | 11/2004 |
| JP | 2005-5065 | A | 1/2005 |
| JP | 2005-68444 | A | 3/2005 |
| JP | 2005-243892 | A | 9/2005 |
| JP | 2005-302681 | A | 10/2005 |
| JP | 2006-164683 | A | 6/2006 |
| JP | 2007-026781 | A | 2/2007 |
| JP | 2007-280641 | A | 10/2007 |
| JP | 2008-4814 | A | 1/2008 |
| JP | 2008-112580 | A | 5/2008 |
| JP | 2009-502554 | A | 1/2009 |
| JP | 2009-534759 | A | 9/2009 |
| JP | 2010-021140 | A | 1/2010 |
| JP | 2010530115 | A | 9/2010 |
| JP | 2011-530155 | A | 12/2011 |
| JP | 2013-520836 | A | 6/2013 |
| JP | 2013-0251367 | A | 12/2013 |
| JP | 2014-518947 | A | 8/2014 |
| KR | 2008-0024693 | A | 3/2008 |
| KR | 10-1179650 | B1 | 9/2012 |
| RU | 2239532 | C1 | 11/2004 |
| TW | I235408 | A | 1/2005 |
| TW | I244673 | A | 1/2005 |
| TW | I233144 | B | 5/2005 |
| TW | I294257 | A | 2/2007 |
| TW | 200714742 | A | 4/2007 |
| TW | 200304343 | A | 10/2009 |
| WO | 96/16531 | A1 | 5/1996 |
| WO | 02079815 | A2 | 10/2002 |
| WO | 2005-047180 | A1 | 5/2005 |
| WO | 2007/015779 | A2 | 2/2007 |
| WO | 2012160145 | A1 | 11/2012 |
| WO | 2015/022621 | A1 | 2/2015 |
| WO | 2016/089424 | A1 | 6/2016 |
| WO | 2016/089427 | A1 | 6/2016 |
| WO | 2016/104076 | A1 | 6/2016 |

OTHER PUBLICATIONS

Chinese Office Action, issued in CN 201510505383.2 dated May 17, 2017, including English language translation, 24 pages.
Chinese Office Action, issued in CN 201510505381.3 dated Jun. 5, 2017, including English language translation, 19 pages.
Chinese Office Action, issued in CN 201510505370.5 dated Jul. 21, 2017, including English language translation, 23 pages.
Office Action issued in U.S. Appl. No. 14/975,286 dated Oct. 23, 2017, 17 pages.
Notification of Reasons for Rejection issued in Japanese Application No. 2015-134116 dated Oct. 24, 2017, along with English translation, 9 pages.
Office Action issued for Chinese Patent Application No. 201510505381.3, dated Feb. 1, 2018, along with the corresponding English translation (15 pages).
Office Action issued for Chinese Patent Application No. 201510505370.5, dated Feb. 5, 2018, along with the corresponding English translation (23 pages).
Office Action issued for U.S. Appl. No. 15/645,774 dated Mar. 9, 2018 (25 pages).
International Search Report and Written Opinion, issued in PCT/US14/68858 dated Mar. 5, 2015, 12 pages.
Office Action issued in U.S. Appl. No. 14/486,779 dated Sep. 28, 2017, 8 pages.
Office Action issued in U.S. Appl. No. 14/486,726 dated Oct. 6, 2017, 15 pages.
Office Action issued in U.S. Appl. No. 14/148,606 dated Oct. 10, 2017, 18 pages.
Office Action issued in U.S. Appl. No. 14/975,415 dated Oct. 19, 2017, 17 pages.
Notification issued in Eurasian Patent Application No. 201400544 dated Dec. 7, 2017, 4 pages.
Office Action issued in U.S. Appl. No. 14/148,606 dated Apr. 5, 2018 (18 pages).
Communication issued in European Patent Application No. 09805431.5 dated Apr. 12, 2018 (10 pages).
International Search Report and Written Opinion dated Mar. 5, 2015, in International Application No. PCT/US2014/068858, 12 pages.
Office Action issued for U.S. Appl. No. 14/975,415 dated May 4, 2018, 18 pages.
Office Action issued for U.S. Appl. No. 14/486,726 dated Jun. 22, 2018, 48 pages.
Office Action issued for U.S. Appl. No. 14/975,286 dated Jun. 28, 2018, 44 pages.
Office Action issued for U.S. Appl. No. 15/645,774 dated Jul. 12, 2018, 63 pages.
Examination Report, in corresponding Philippine Application No. 1/2015/500540, dated May 8, 2018, 2 pages.
Extended European Search Report dated Jul. 3, 2018, issued in European Patent Application No. 14907243.1, 10 pages.
Extended European Search Report dated Jul. 16, 2018, issued in European Patent Application No. 14907576.4, 9 pages.
Garcia-Cespedes, et al., "Carbon nanotubes grown by asymmetric bipolar pulsed-DC PECVD", Diamond and Related Materials, vol. 16, pp. 1131-1135, Jan. 25, 2007.
L. Bardos, et al., "Linear Arc Discharge (LAD)—Radio Frequency Hollow Cathode Plasma Source for Low Pressure Processing," 1996 Society of Vacuum Coaters, 39th Annual Technical Conference Proceedings (1996), ISSN 0737-5921, pp. 128-132.
L. Bardos, et al., "PECVD by Hollow Cathodes," 1998 Society of Vacuum Coaters, 41st Annual Technical Conference Proceedings (1998), ISSN 0737-5921, pp. 315-320.
A. Belkind, et al., "Linear Plasma Source for Reactive Etching and Surface Modification," 1995 Society of Vacuum Coaters, 38th Annual Technical Conference Proceedings (1995), ISSN 0737-5921, pp. 432-436.
A. E. Delahoy, et al., "Transparent and semitransparent conducting film deposition by reactive-environment, hollow cathode sputtering," American Vacuum Society, J. Vac. Sci, Technol. A 23(4), Jul./Aug. 2005, pp. 1215-1220.

(56) References Cited

OTHER PUBLICATIONS

J. Madocks, et al., "Large Area Plasma Enhanced Chemical Vapor Deposition of SiO2 on Glass and Plastic," 2007 Society of Vacuum Coaters, 50th Annual Technical Conference Proceedings (2007), ISSN 0737-5921, pp. 233-238.
A.A. Pradhan, et al., "High Deposition Rate Reactive Sputtering with Hollow Cathode," 2002 Society of Vacuum Coaters, 45th Annual Technical Conference Proceedings (2002), ISSN 0737-5921, pp. 96-100.
C. M. Horwitz, "Silicon deposition in diode and hollow-cathode systems," 1989 American Vacuum Society, J. Vac. Sci. Technol. B 7 (3), May/Jun. 1989, pp. 443-449.
S.K. Deb, "The Role of Vacuum Coatings in Cost-Effective Photovoltaic Technologies," Society of Vacuum Coaters, 51st Annual Technical Conference Proceedings, Apr. 19-24, 2008, ISSN 0737-5921, pp. 101-106.
M. Mildner et al., "13.56 MHz hollow cathode jet matrix plasma source for large area surface coating," Surface and Coatings Technology, vol. 112, pp. 366-372, XP000983344 (1999).
D. Child et al., "Enhanced Hollow Cathode Plasma Source for Low Pressure Electron-Beam Deposition Processes", 2014 Society of Vacuum Coaters 505/856-7188, ISSN 0737-5921, May, 2014, 6 pages.
B. Buchholtz, "Physics of Ion Beam Sources" 7 pages.
M. Proschek et al., "The effect of phase difference between powered electrodes on RF plasmas", Plasma Sources Sci. Technol. 14, 2005, 407-411.
Argentine Office Action issued in AR 072911 A1, dated Jun. 11, 2013, 4 pages.
Chinese Office Action, issued in CN 200980139450.6 dated Dec. 29, 2014, including English language translation, 9 pages.
Chinese Office Action, issued in CN 201410641340.2 dated Jun. 2, 2016, including English language translation, 11 pages.
Chinese Office Action, issued in CN 201510505370.5 dated Nov. 28, 2016, including English language translation, 22 pages.
Eurasian Office Action issued in EA 201100298 dated Mar. 16, 2013, 2 pages.
Extended European Search Report, issued in EP 09805431.5 dated Aug. 4, 2014, 16 pages.
European Search Report, issued in EP 09805431.5 dated Apr. 8, 2016, 6 pages.
Indian First Examination Report issued in in 357/MUMNP/2011 dated Aug. 21, 2017, including English language translation, 10 pages.
Japanese Office Action issued in JP 2011-522159 dated Jun. 25, 2013, including English language translation, 8 pages.
Japanese Office Action issued in JP 2011-522159 dated Mar. 18. 2014, including English language translation, 8 pages.
Japanese Office Action, issued in JP 2015-134085 dated Aug. 23, 2016, including English language translation, 9 pages.
Japanese Office Action, issued in JP 2015-134098 dated Aug. 30, 2016, including English language translation, 10 pages.
Japanese Office Action, issued in JP 2015-134106 dated Aug. 30, 2016, including English language translation, 10 pages.
Japanese Office Action, issued in JP 2015-134112 dated Aug. 2, 2016, including English language translation, 5 pages.
Japanese Office Action, issued in JP 2015-134116 dated Aug. 30, 2016, including English language translation, 10 pages.
Japanese Office Action, issued in JP 2015-134098 dated Jan. 10, 2017, including English language translation, 11 pages.
Japanese Office Action, issued in JP 2015-134116 dated Mar. 28, 2017, including English language translation, 9 pages.
Japanese Office Action, issued in JP 2015-134112 dated Jul. 4, 2017, including English language translation, 5 pages.
Korean Office Action, issued in KR 10-2011-7005282 dated Aug. 22, 2015, including English language translation, 21 pages.
PCT International Search Report and Written Opinion, issued in PCT/US 09/52679 dated Sep. 28, 2009, 12 pages.
International Search Report and Written Opinion, issued in PCT/US2014/068919 dated Feb. 24, 2015, 13 pages.
International Search Report and Written Opinion, issued in PCT/US2016/061134 dated Jan. 9, 2017, 24 pages.
International Search Report and Written Opinion, issued in PCT/US2016/060979 dated Jan. 9, 2017, 16 pages.
Taiwanese Office Action, issued in TW 098126292 dated Mar. 23, 2015, including English language translation, 41 pages.
Taiwanese Office Action, issued in TW 10521126650, dated Sep. 9, 2016, including English language translation, 10 pages.
Taiwanese Office Action, issued in TW 10521126670, dated Sep. 9, 2016, including English language translation, 9 pages.
Taiwanese Office Action, issued in TW 105103045, dated Dec. 30, 2016, including English language translation, 7 pages.
United Arab Emirates Office Action issued in UAE 119/2011 dated Apr. 10, 2016, 17 pages.
Non-final Office Action, issued in U.S. Appl. No. 14/942,737, dated Sep. 22, 2016, 53 pages.
Non-final Office Action, issued in U.S. Appl. No. 14/486,779, dated Mar. 24, 2017, 80 pages.
Non-final Office Action, issued in U.S. Appl. No. 14/148,606, dated Apr. 6, 2017, 36 pages.
Non-final Office Action, issued in U.S. Appl. No. 14/975,286, dated Apr. 7, 2017, 61 pages.
Non-final Office Action, issued in U.S. Appl. No. 14/975,415, dated Apr. 14, 2017, 69 pages.
Final Office Action, issued in U.S. Appl. No. 14/486,726, dated May 17, 2017, 38 pages.
Non-final Office Action, issued in U.S. Appl. No. 15/645,774, dated Aug. 28, 2017, 58 pages.
Philippine Office Action issued in PH 1/2011/500255 dated Jul. 16, 2013, 1 page.
Office Action issued for Japanese Patent Application No. 2017-093637 dated May 29, 2018, along with English translation, 10 pages.
Office Action issued for Japanese Patent Application No. 2017-529720 dated Sep. 25, 2018, along with English translation, 12 pages.
Office Action issued for U.S. Appl. No. 15/645,774 dated Oct. 18, 2018, 28 pages.
Office Action issued for Eurasian Patent Application No. 201791237 dated Dec. 26, 2018, along with English translation, 4 pages.
Office Action issued for Japanese Patent Application No. 2017-529717 dated Nov. 27, 2018, along with English translation, 4 pages.
Office Action issued for U.S. Appl. No. 14/975,415 dated Dec. 13, 2018, 16 pages.
Office Action issued for Eurasian Patent Application No. 201791234 dated Dec. 11, 2018, along with English translation, 2 pages.
Office Action issued for Japanese Patent Application No. 2017-146662 dated Aug. 7, 2018, along with English translation, 6 pages.
Office Action issued for Japanese Patent Application No. 2015-134106 dated Aug. 28, 2018, along with English translation, 13 pages.
Office Action issued for Chinese Patent Application No. 201480084542.X dated Dec. 29, 2018, along with English translation, 24 pages.
Office Action issued for Chinese Patent Application No. 201510505370.5 dated Dec. 14, 2018, along with English translation, 6 pages.
Office Action issued for U.S. Appl. No. 15/532,845 dated Dec. 31, 2018, 33 pages.
Office Action issued for Chinese Patent Application No. 20148004528.X dated Feb. 28, 2019, along with English translation, 18 pages.
Office Action issued for Japanese Patent Application No. 2017-146662 dated Mar. 26, 2019, along with English translation, 11 pages.
Examination Report, in corresponding Philippine Patent Application No. 1/2015/500539, dated Apr. 10, 2019, 5 pages.
Office Action issued in Brazilian Patent Application No. PI0916880-0 dated May 28, 2019, 7 pages.
Extended European Search Report issued in European Patent Application No. 16866871.3, dated Jul. 3, 2019, 10 pages.
Substantive Examination Report issued in Philippine Patent Application No. 1/2015/500541, dated Jul. 5, 2019, 7 pages.

(56) References Cited

OTHER PUBLICATIONS

Office Action issued for U.S. Appl. No. 15/532,845 dated Jul. 9, 2019, 67 pages.
Extended European Search Report issued in European Patent Application No. 16876262.3, dated Jul. 19, 2019, 11 pages.
Office Action issued for Japanese Patent Application No. 2018-532069 dated May 28, 2019, along with English translation, 15 pages.
Office Action issued for Japanese Patent Application No. 2017-529720 dated Jul. 23, 2019, along with English translation, 17 pages.
Office Action issued in Chinese Patent Application No. 201680078860.4, dated Aug. 1, 2019, with English translation, 31 pages.
Office Action issued in Eurasian Patent Application No. 201791234, dated Aug. 27, 2019, with English translation, 3 pages.
Office Action issued in Eurasian Patent Application No. 201791237, dated Aug. 29, 2019, with English translation, 3 pages.
Office Action issued in Chinese Patent Application No. 201480084542.X, dated Sep. 11, 2019, with English translation, 22 pages.
Office Action issued in Chinese Patent Application No. 201680081988.6, dated Sep. 25, 2019, with English translation, 35 pages.
Office Action issued in Chinese Patent Application No. 201480084528.X, dated Nov. 7, 2019, with English translation, 16 pages.
Office Action issued for U.S. Appl. No. 15/532,845 dated Dec. 12, 2019, 58 pages.

\* cited by examiner

HOLLOW CATHODE PLASMA SOURCE

CROSS REFERENCE TO RELATED APPLICATION(S)

This application is a 35 U.S.C. § 371 National Phase Entry Application from PCT/US2014/068858, filed Dec. 5, 2014, designating the United States. This application is related to PCT International Application Ser. No. PCT/US2014/068919 titled "Plasma Source Utilizing a Macro-Particle Reduction Coating and Method of Using a Plasma Source Utilizing a Macro-Particle Reduction Coating for Deposition of Thin Film Coatings and Modification of Surfaces," the disclosure of which is incorporated herein by reference.

BACKGROUND OF THE INVENTION

The present invention relates to a plasma source for the surface treatment and/or coating of large substrates. More particularly the present invention relates to a linear plasma source for plasma enhanced chemical vapor deposition and for plasma surface treatment, in particular a plasma source based on a hollow cathode type discharge.

Various plasma sources are disclosed in the prior art for the deposition of thin films and chemical modification of surfaces.

When large substrates are to be treated, these plasma sources typically are linear ionic sources like the one disclosed by Madocks in U.S. Pat. No. 7,411,352. This plasma source is based on a magnetron discharge and produces a linear beam of ions or, by combining several sources, multiple parallel beams of ions directed towards the substrate surface. Madocks discloses that for coating purposes a coating precursor can be provided outside of the plasma sources. The plasma extends essentially only along one dimension, i.e. the length of plasma source. The width of the ion beam is limited by the pressure inside the process chamber which restricts the mean free path length. When a substrate is conveyed beneath this plasma source the contact time is therefore relatively short. Thus the number of plasma sources will have to be multiplied when for example the treatment duration of the substrate with the plasma needs to be increased. Furthermore a coating precursor injected next to the plasma source has limited opportunity to interact with the plasma beam. This results in relatively low deposition yield and increases the risk of soiling the coater with precursor that has not been able to react with the substrate surface.

Madocks also discloses that sputtering of the electrode material occurs and that the sputtered material redeposits and thus remains within the source. Sputtering of the electrode material however results in reduced lifetime of the electrodes. The redeposition of the sputtered material may also lead to blockage of the nozzles of the plasma source, making a uniform substrate treatment or coating impossible. Furthermore, the sputtered electrode material may condense and/or react further, leading to the formation of debris that either block the source's nozzles or fall on the substrate creating defects. These nozzles are made up by one of the plasma source's electrodes. The electrode is thus exposed to the coating process atmosphere in the vacuum chamber and therefore prone to soiling from the injected coating precursor.

Furthermore the magnetron discharge based source disclosed by Madocks requires magnets. Magnets are sensitive to high temperatures, these sources therefore cannot be run at high temperatures and need to be cooled by active or passive means. The presence of these magnets as well as the necessary presence of shunts lead to a complex and thus expensive assembly.

This source also produces a relatively low density of free electrons compared to plasma sources based on hollow cathode discharge. For coating purposes, the electrons of the plasma serve to ionize the coating precursor. Therefore the coating efficiency is low when a magnetron plasma based source such as disclosed by Madocks is used.

Jung discloses in EP0727508 A1 a hollow cathode linear plasma source based on two parallel electrodes. The plasma extends essentially only along one dimension, i.e. the length of plasma source, forming a narrow plasma beam. Jung discloses that in order to avoid sputtering of the electrode material a stream of inert gas has to be injected parallel to the electrodes. The injection of an inert gas parallel to the electrodes however leads to a reduction of the yield of reactive ions and therefore reduced treatment efficiency or coating yield.

One of the major problem with these kinds of high deposition rate sources is the fact that the walls of the plasma sources become quickly soiled by reacting prematurely with precursors that flow through the plasma. Due to this problem, the use of this process in industry is quite limited and requires frequent cleaning cycle which limits the throughput of the production line.

Another drawback of these high deposition rate sources is that it is difficult to confine the precursor to the substrate surface after it leaves the plasma source. As a consequence a significant portion of the precursor cannot be used to form a coating on the substrate. This leads to reduced coating yield and to soiling of the coater with the transformation of the precursor on surfaces surrounding the plasma source.

Thus there remains a need in the large area surface treatment and large area coating field for a simple plasma source that can provide a uniform plasma of considerable length that can treat and/or coat large substrates with high efficiency and low amount of soiling and of defects.

SUMMARY OF THE INVENTION

In an aspect of the invention there is provided a linear plasma source useful for the deposition of thin films on large substrates and for the plasma treatment of the surfaces of large substrates. Plasma treatment is meant to encompass e.g. surface activation, surface cleaning as well as surface etching.

In an aspect of the present invention there is provided a hollow cathode based plasma source with a very wide linear plasma.

In an aspect of the present invention there is provided a plasma source that is able to form a uniform wide linear plasma.

In an aspect of the present invention there is provided a plasma source with a low rate of electrode cavity surface sputtering.

In an aspect of the present invention there is provided a plasma source with a high density of free electrons.

In an aspect of the present invention there is provided a method of forming a large area coating using a uniform wide linear plasma.

BRIEF DESCRIPTION OF THE FIGURES

These aspects as well as other aspects of the invention will be clarified in the detailed description of particular embodiments of the invention with reference to the drawings of the figures, wherein.

DETAILED DESCRIPTION OF THE INVENTION

Figure 1:
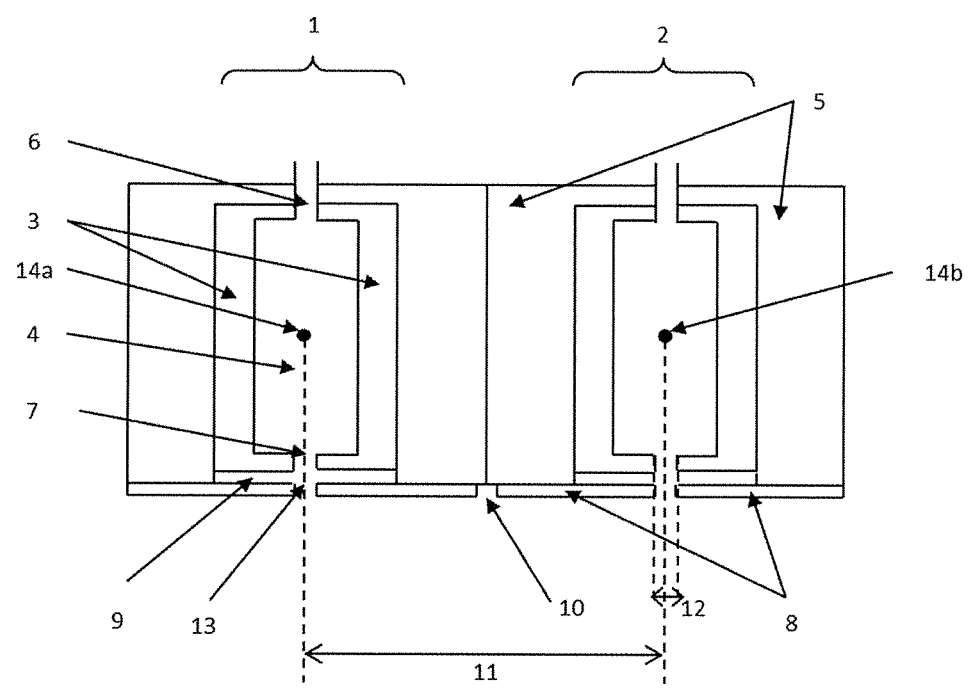
FIG. 1 Shows a section view of a plasma source according to the present invention FIG. 2 Shows a section view of another plasma source according to the present invention FIG. 3 Shows a section view of another plasma source according to the present invention.

FIG. 1 shows a transverse section view of a hollow cathode plasma source according to the present invention comprising a first electrode 1 and a second electrode 2, respectively having a first electron emitting surface and a second electron emitting surface which are the walls of the cavities 3 and being positioned in proximity to each other. The first and second electrodes each substantially encloses an elongated gas containing volume 4, i.e. a hollow cathode cavity. The distance between the hollow cathode cavities 11 is measured from one cavity center 14a to the other cavity center 14b. The electrodes extend substantially parallel to each other. The cathodes may be oriented perpendicular to the moving direction of the substrate to be treated or at an angle to this direction. The first and second electrodes are essentially surrounded by insulating material 5. The first and second electrodes are both provided with a gas inlet for the plasma forming gas 6 and with a gas outlet for the ionized plasma gas 7. At the outlet the gas is directed through an outlet nozzle 13 towards the vacuum chamber in which the plasma source is placed and towards the substrate within the vacuum chamber. The gas outlet nozzle has a certain width 12. The first and second electrodes are electrically connected to an AC power source (not depicted) supplying a voltage that is alternating between positive and negative. In between the vacuum chamber structure 8 that supports the plasma source and the electrodes there is a dark space or solid electrical insulator 9. A coating precursor injection nozzle 10 may also be combined with the plasma source to perform plasma enhanced chemical vapor deposition. The nozzle 10 directs a coating precursor comprising gas towards the plasma generated by the plasma source in the vacuum chamber. Structural elements as well as cooling elements and electrical connections are not shown.

Hollow cathode plasma source is taken to mean a plasma forming device typically described as two cavities alternating between positive (anode) and negative potential (cathode) with a 180° phase shift. In the cathode cavity electrons are oscillating between negative electric fields of the cavity and are thereby confined.

Plasma is taken to mean an electrically conductive gaseous medium comprising both free electrons and positive ions.

Reactant gas is taken to mean oxygen and/or nitrogen. It is often desirable to deposit on a surface compounds which may not be chemically available from the precursor gas alone. Often, reactant gases such as oxygen or nitrogen are added to the chemical vapor deposition (CVD) process to form oxides or nitrides. Other reactant gases may comprise fluorine, chlorine, other halogens or hydrogen. A reactant gas may be differentiated from a precursor gas by the fact that even when energized or chemically decomposed, condensable molecular entities are not formed. Generally, reactant gases or reactant gas fragments cannot by themselves grow a solid deposition but they can react and become chemically incorporated into a solid deposition derived from precursor gases or other solid deposition sources. Preferred reactants are $O_2$, $N_2$, $NH_3$, $CH_4$, $N_2O$, $H_2$.

Precursor is taken to mean a gas or a liquid, selected according to its vapor pressure, in molecular form containing a chemical element or elements to be condensed into a solid coating. The elements to be condensed from the precursor may include metals, transition metals, boron, carbon, silicon germanium and/or selenium. Generally, a precursor molecule is unreactive or not prone to attaching on a surface until energized, partially decomposed, or fully decomposed by an energy source, whereupon a chemical fragment of the precursor containing the desired chemical element for coating becomes chemically able to bond to or condense upon a surface in a solid form. The condensed portion of the precursor compound may be primarily a pure element, a mixture of elements, a compound derived from the precursor compound constituents or a mixture of compounds. Preferred precursor gas are inorganic compounds such as: $SiH_4$, $N(SiH_3)_3$, TMDSO, HMDSO, TTIP, . . . or any other that contain appropriate metal to deposit oxide, nitride or oxynitride films such as: $SiO_2$, $Si_xN_y$, $ZrO_2$, $TiO_2$, $Al_2O_3$, AlN, SnO2, ZnO, etc. . . . and mixtures of one or more of these materials, such as $SiO_xN_y$, $Si_xAl_yN_z$.

Substrate is taken to mean either a small area or large area item to be coated or have its surface chemically modified by this invention. Substrate referred to herein can be comprised of glass, plastic, metal, inorganic materials, organic materials or any other material that has a surface to be coated or modified.

AC power or AC power source is taken to mean electric power from an alternating source wherein the voltage is changing at some frequency in a manner that is sinusoidal, square wave, pulsed or according to some other waveform. Voltage variations are often from negative to positive. When in bipolar form, power output delivered by two leads is generally about 180 degrees out of phase.

Secondary electron or secondary electron current is taken to mean electron emission from a solid surface as a result of bombardment of that surface by a particle and the current that is created as a result, respectively.

Dark space is taken to mean a narrow zone or area around an electrode whereby plasma current is very low. Generally, two oppositely charged plasma electrodes or a plasma electrode and a ground potential conductor spaced apart by the dark space distance will exhibit substantially no current flow between them.

The construction material for the electrodes must be sufficiently electrically conductive so that electrons can be emitted from the electrode surfaces and so that they can carry the necessary electrical current to sustain the discharge. Electrode materials comprise metals, metal alloys, metal compounds, carbon, carbon compounds, ceramics, or semiconductors. Most commonly used materials are metals, metal alloys or graphitic carbon.

Electrode materials may be selected for particular electron emission properties. They may comprise materials with low work function or with high secondary emission coefficients which allow lower operating voltages and increased electron current.

The electron emitting surfaces may comprise metal, metal-based, metalloid, metalloid-based or carbon-based coatings deposited on the electrodes. These coatings may comprise materials with low work function or with high secondary emission coefficients which allow lower operating voltages and increased electron current.

Almost any gas may be used as plasma forming gas. Most commonly the plasma forming gas comprises He, Ne, Ar, Kr, Xe, $O_2$, $N_2$, $H_2$, $NH_3$ or mixtures on any of these gases. The gas flow rate is generally comprised between 0.5 sccm and 10 sccm per linear mm of cavity length.

Different arrangements and shapes are possible for the outlet and nozzle. Typically they are an array of holes. They may also comprise a slot or elongated orifice. A gas pressure drop exists between the hollow cathode cavities and the exterior, i.e. the vacuum chamber. Thereby a sufficiently high pressure level for sustaining a stable plasma is maintained in the cathode cavity and an outflow of the ionized gas from the cavity towards the exterior is obtained. The nozzles thus distance the electrodes from the coating process atmosphere in the vacuum chamber and therefore reduce the probability of soiling from the injected coating precursor.

The first and second hollow cathode electrodes function alternatingly as cathodes and anodes. When one electrode is electrically positive with respect to the plasma potential, the other one is electrically negative with respect to the plasma potential and this electrical polarity reverses at some frequency.

This may be obtained by using an AC power source or a pulsed DC power source. Typically the power sources supply a bipolar voltage approximately 180 degrees out of phase with an alternating polarity of the phases such that the electron current between the electrodes reverses at some frequency. The preferred voltage range is comprised between 300V and 1200V, the preferred frequency range is comprised between 10 kHz and 1 MHz, preferably between 10 kHz and 100 kHz, most preferably about 40 kHz.

The plasmas formed by the hollow cathode plasma source of this invention are non-equilibrium, non-thermal plasmas that are highly electrically conductive and that typically carry a charge of ground potential of several 10's of volts positive. The electrodes are placed in sufficient proximity to allow an electron current to flow between electrodes of opposite polarity at the operating pressure of the vacuum chamber.

The operating pressure in the vacuum chamber may be kept between 0.001 mbar and 1 mbar, typically between 0.002 mbar and 0.1 mbar, more typically between 0.007 and 0.05 mbar.

A plasma is formed in the volumes enclosed by the first and second electron emitting surfaces, plasma that extends throughout the gas containing space that lies in between the electron emitting surfaces. The plasma is made substantially uniform over its length in the substantial absence of closed circuit electron drift.

Thereby the plasma source according to the invention forms a linear plasma beam that has a high density of free electrons and that is not limited to a narrow width beneath the plasma source but rather extends in between the two hollow cathode cavities. The plasma source according to the present invention therefore allows high contact times between substrate and plasma. It also presents better opportunities for a coating precursor injected in proximity to the plasma beam to interact with it. Thereby high deposition yields and high treatment efficiencies are provided while the risk of soiling of the plasma source as well as the coater as a whole is reduced.

Furthermore the plasma source according to the invention requires no additional electrodes, acceleration grids, magnetic fields, shunts, or neutralizers. It is therefore less complex and thus less costly than other plasma sources.

However, when desired for particular reasons, magnets and/or additional electrodes may be used in conjunction with the arrangement of hollow cathodes according to the present invention.

In an aspect of the invention, there are provided dimensions of certain key parameters of the hollow cathode plasma source.

The key parameters identified by the inventors are:
The cavity cross section shape
The cavity cross section area
The outlet nozzle width
The cavity distance The inventors recognize the surprising effect of these key parameters. They have discovered that among all parameters that govern these plasma sources, these parameters in particular, either alone or in combination, have a significant impact on the density of free electrons in the plasma generated by the hollow cathode plasma source and as well as the amount of sputtering of the plasma source cavity surfaces. To achieve these effects, the inventors have discovered that these key parameters need to respect specific dimensions. The dimensions of these key parameters may be different for each hollow cathode plasma source cavity, preferably they are the same for both hollow cathode plasma source cavities.

According to an advantageous embodiment specific dimensions of these key parameters separately or in any combination lead to a reduced amount of sputtering of the cavity surfaces. The plasma source according to the invention therefore does not require the injection of an inert gas parallel to the electrodes. Therefore a high yield of reactive species is obtained leading to high treatment efficiency or coating yield. The plasma source according to the present invention therefore also limits redeposition of sputtered material inside the plasma source and its nozzles and also reduces the formation of debris. Thus the treatment or coating uniformity are improved and the amount of defects in the treatment or coating is reduced.

According to an advantageous embodiment the hollow cathode discharge based plasma source together with specific dimensions of these key parameters separately or in any combination also lead to increased density of free electrons. Therefore the treatment efficiency or coating efficiency is increased. Furthermore the more efficient usage of coating precursor leads to reduced soiling of the vacuum chamber and vacuum pumps by unreacted coating precursor.

Figure 2:
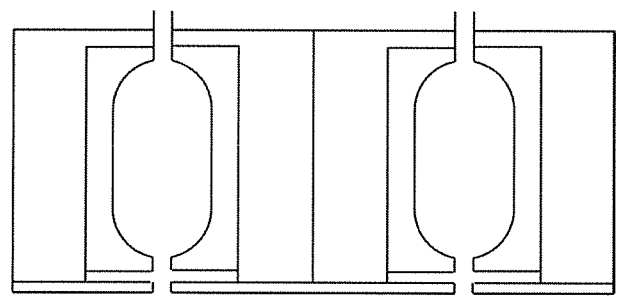
Figure 3:
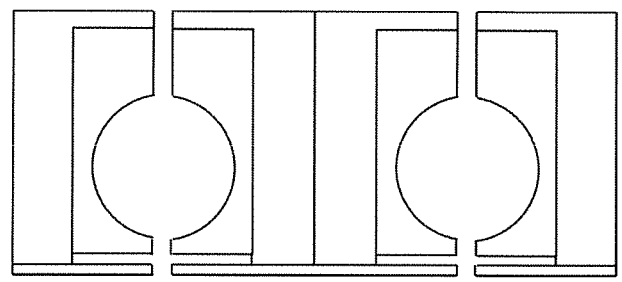

During long duration trials of more than 100 hours it was observed that plasma sources with a rounded rectangular cavity cross section shape (FIG. 2) showed significantly more cavity surface sputtering than plasma sources with a circular cross section shape (FIG. 3).

By comparing experimental results with computer simulation data, the inventors have found that the amount of sputtering of the hollow cathode cavity surfaces is related to the absorption of reactive ions on the hollow cathode cavity surfaces as determined by numerical simulation.

The simulation software that was used for simulating gas flows and gas discharges is a program called PIC-MC that has been developed by the Fraunhofer-Institute for Surface Engineering and Thin Films IST, Braunschweig, Germany. The software combines the simulation of gas flows, magnetic fields and plasma. For the gas flow simulation it uses the Direct Simulation Monte Carlo (DSMC), for the magnetic field simulation it uses the Boundary Element Method (BEM) and for the plasma simulation it uses the Particle in Cell-Monte Carlo method (PIC-MC).

The simulations were made on a pseudo 2D model which is a transversal 1.016 mm thick slice of the hollow cathode plasma source. Pseudo-2D means that the slice has a small thickness and a periodic condition is applied on each plane in the transversal direction.

For the simulations many different plasma forming gasses can be used, in the following examples argon was used. In order to limit the computation time $Si_2H_6$ was chosen as coating precursor and among its possible reactions the following two were selected:

$$Si_2H_6 + e^- \rightarrow Si_2H_4^+ + 2H + 2e^- \quad (1)$$

$$Si_2H_6 + e^- \rightarrow SiH_3 + SiH_2 + H + e^- \quad (2)$$

Hydrogen species were not included in the simulations.

For each given set of input parameters the simulation yields data regarding number and velocity of the different gas phase species (atoms, ions, molecules and electrons) throughout the space they occupy. From this data certain values can be calculated, such as densities and fluxes, where a flux is the rate of movement of gas phase species across a unit area (unit: $mol \cdot m^{-2} \cdot s^{-1}$).

Another useful calculation is the flux that is absorbed on a certain surface. Given a certain sticking coefficient of the cathode cavity material, the ion absorption on its surface can be calculated from the ion flux directed at it. By correlating experimental results with simulation data the inventors found that the formation of debris and thus the cavity surface sputtering observed on real plasma sources was related to the level of ionized plasma species absorbed by the electrodes' cavity surfaces according to the simulation model.

Low levels of ionized plasma species absorbed by the electrodes' cavity surfaces mean that the level of cavity sputtering is low and debris formation is low.

Another important quantity is the electron density generated. The electron density has a major influence on surface treatment or coating efficiency, with high electron densities leading to high surface treatment or coating efficiencies. In the present simulations the electron density was determined in the vacuum chamber on a line set at a distance of 2.54 mm from the chamber structure that supports the plasma source and averaged.

In one aspect of the invention there is provided a hollow cathode cavity transverse cross section shape.

The inventors surprisingly found that the level of ionized plasma species absorbed by the cathode cavity surfaces was reduced when the rectangular cavity cross section shape was replaced by a cross section enclosing the same surface area having a rectangular shape where at least one corner is rounded or preferably all four corners are rounded (rounded rectangular shape), or preferably having a rounded rectangular shape whose four corner radii are equal to half its width or most preferably having a circular shape.

FIG. 2 Shows a section view of a plasma source according to the present invention having a rounded rectangular cavity cross section shape.

FIG. 3 Shows a section view of a plasma source according to the present invention having a circular cavity cross section shape.

Figure 5:
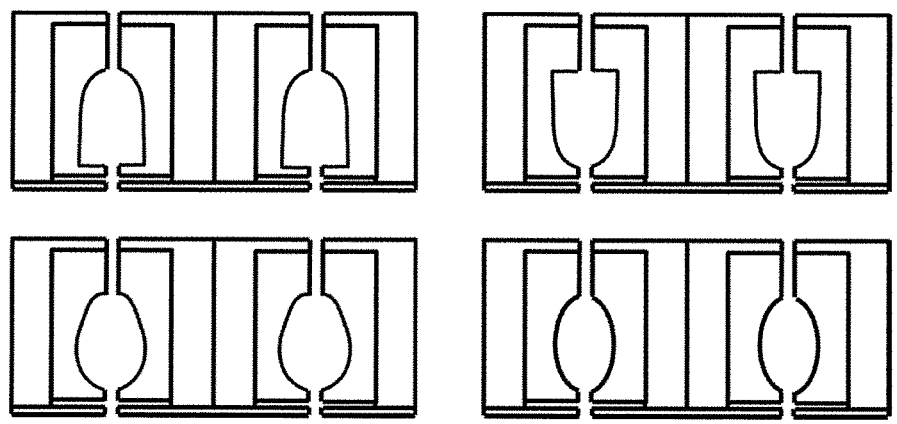
FIG. 5 Shows a section view of possible variations of the plasma sources according to the present invention.

Variations to these shapes, in particular leading to intermediary shapes, may be made without departing from the present invention. In particular these are elliptical or oval shapes or shape variations such as illustrated in FIG. 5.

Furthermore the inventors found that the circular cavity cross section shape also improved the electron density over the rectangular shape.

In one aspect of the invention there is provided a hollow cathode cavity transverse cross section area.

According to an embodiment of the invention the cavity cross section area is comprised between 100 mm² and 10000 mm², preferably between 500 mm² and 4000 mm².

According to another embodiment of the present invention the cavity cross section area is comprised between 100 mm² and 1000 mm², preferably between 500 mm² and 1000 mm², most preferably between 500 mm² and 750 mm². The inventors surprisingly found that at lower cavity cross section area, electron density was increased.

According to another embodiment of the present invention the cavity cross section area is comprised between 1000 mm² and 4000 mm², preferably between 1500 mm² and 4000 mm², most preferably between 2000 mm² and 4000 mm². The inventors surprisingly found that at higher cross section area the level of ionized plasma species absorbed by the cathode cavity surfaces was reduced.

According to another embodiment of the present invention the cavity cross section area is comprised between 750 mm² and 1500 mm², preferably between 750 mm² and 1250 mm², most preferably around 1000 mm². The inventors found that at an intermediate cross section area a balanced level of ionized plasma species absorbed by the cathode cavity surfaces versus electron density was obtained.

In one aspect of the invention there is provided a hollow cathode cavity distance, measured from one cavity center to the other cavity center. The center of the cavity is the geometrical center of the cavity cross section if it has a regular geometrical shape. If it has an irregular shape it is its centroid.

The inventors surprisingly found that increasing the hollow cathode cavity distance up to a certain threshold leads to a reduced level of ionized plasma species absorbed by the cathode cavity surfaces with decreased electron density. According to the invention the cavity distance is comprised between 85 mm and 160 mm, preferably between 100 mm and 145 mm, most preferably around 125 mm.

It is clear to the person skilled in the art that the cavity distance is also dependent on the cavity size and on insulation, structural and cooling requirements.

In one aspect of the invention there is provided an outlet nozzle width.

In the present design the outlet nozzles are centered at the vertical line running through the center of the cavity cross section shape. The centers of each cavity cross section and of its outlet nozzle are aligned with the vertical line running through the cavity cross section's center. However variations and modifications of the outlet nozzle placement and orientation may be made without departing from the present invention.

In its basic design the outlet nozzle width is in the range of 3.5 mm to 5 mm. The inventors found that increasing the width reduced the level of ionized plasma species absorbed by the cathodes cavity surfaces and increased the electron density. When the outlet nozzle width is increased above a threshold value the electron density is strongly reduced. Probably because the pressure in the cavity cannot be maintained at a level high enough to produce a significant plasma discharge.

According to the present invention the outlet nozzle width is comprised between 1 mm and 25 mm, preferably between 3 mm and 25 mm, more preferably between 8 mm and 22 mm, more preferably between 8 mm and 12 mm, most preferably around 10 mm.

According to another embodiment of this invention two or more plasma sources can be combined to increase the surface treatment or coating duration, using a single power source in common or using multiple individual power sources.

According to another embodiment of the present invention the plasma source is used for surface treating a substrate, e.g. surface cleaning, surface refreshment, surface activation. The substrate is conveyed beneath the plasma source and exposed to the ions and electrons of the plasma that extends throughout the vacuum space in between the outlet nozzles of the plasma source.

Figure 4:
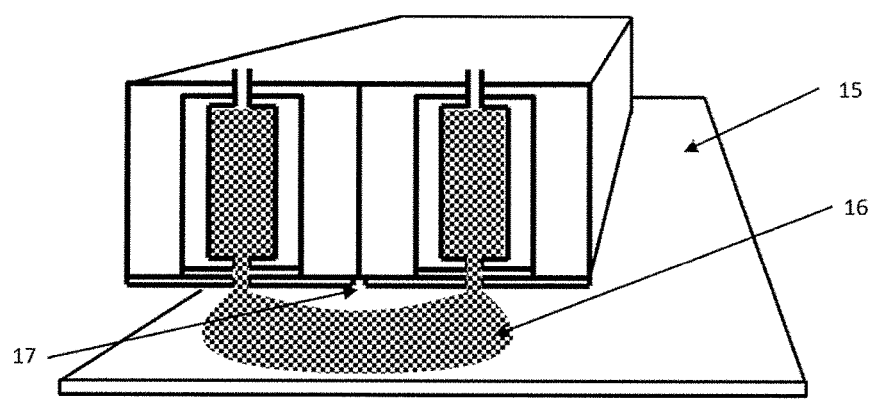
FIG. 4 Shows a section view of a plasma source according to the present invention being used for the surface treatment or coating of a substrate.

According to another embodiment of the present invention the plasma source is used for coating a substrate. FIG. 4 shows the substrate 15 being conveyed beneath the plasma source and exposed to the ions and electrons of the plasma 16 that extends throughout the vacuum space in between the two nozzles of the plasma source. The coating precursor gas is injected through nozzle 17 to be activated by the plasma in order to form the coating on the substrate.

Examples 1 & 2

Plasma sources with two 10 cm (plasma length) long stainless steel hollow electrodes according to the present invention were built and operated for more than 100 hours under the following conditions:
Voltage amplitude+/−1200V
Frequency 40 kHz
Voltage function: bipolar, sinusoid with voltage control
Power set point 20 kW, plasma source is operated in power control mode
Plasma forming gas $O_2$—flow rate 2 sccm per linear mm of cavity length
cathode cavity cross section area 2000 $mm^2$
Vacuum chamber pressure: 8-12 mTorr
Outlet nozzle width: 3.5 mm Two different cavity cross section shapes were compared, rounded rectangular and circular.

Cavity surface sputtering lead to the formation of debris particles. At 24 hour intervals the debris on the glass substrate was collected and the number of debris particles was counted. As can be seen from the table below the number of debris particles increased much more rapidly for the rounded rectangular cavity cross section shape than for the circular shape.

| Example nr | Cavity cross section shape | Time of debris collection |  |  |  |  |  |
|---|---|---|---|---|---|---|---|
|  |  | 24 h | 48 h | 72 h | 96 h | 120 h | 144 h |
| 1 | Rounded rectangular | 5 | 5 | 28 | 53 | 80 | 91 |
| 2 | Circular | 11 | 0 | 7 | 9 | 2 | 1 |

Simulation Examples

In examples 3 to 17 hollow cathode plasma sources were simulated.

For each key parameter a set of up to five variations was compared. In each set one variation was chosen as reference. After calculating for each variation the level of absorption of ionized plasma species on the cathode cavity surfaces as well as of the electron density, the ratio of this value to the reference's value was determined.

The following parameters are kept unchanged for all simulation examples:
Voltage amplitude+/−1200V
Frequency 100 kHz
Voltage function: bipolar, sinusoid with voltage control
Power set point 25 kW/m
Wall temperature 300K
Precursor gas species $Si_2H_6$ flow rate 0.13 sccm per linear m of cavity length
Plasma forming gas Ar—flow rate 2.65 sccm per linear m of cavity length
Electrode material having a secondary electron emission yield of 0.1 (comparable to Ag, Cu, Al, Ti, Zn, Fe)
Vacuum chamber pressure about 10 mTorr by tuning vacuum pumping Examples 3 to 5—Key Parameter: Cavity Cross Section Shape Three cavity cross section shapes were simulated: rectangular, rounded rectangular and circular. The rectangular cross section was 10 mm wide and 50 mm high. The rounded rectangular shape was about 14 mm wide and 45 mm high with four rounded corners (corner radii: 7 mm). The circular cross section shape had a radius of 13 mm.

The following parameters were kept the same for examples 3 to 5:
Cavity cross section area: about 500 $mm^2$
Outlet nozzle width: 5 mm
Cavity distance 122 mm

| Example | | Cathode cavity ionized plasma species absorption ratio | Electron density ratio |
|---|---|---|---|
| 3 | Rectangular (reference) | 1 | 1 |
| 4 | Rounded rectangular | 0.87 | 0.90 |
| 5 | Circular | 0.80 | 1.09 |

Absorption of ionized plasma species on the cathode cavity and thus cavity sputtering and debris formation decrease when going from rectangular to rounded rectangular to circular cavity cross section shape.

Electron density and thus process efficiency increase when going from rectangular to circular cavity cross section shape.

Examples 6 to 8—Key Parameter: Cavity Cross Section Area

Three cathode cavity cross section areas were simulated: 500 $mm^2$, 1000 $mm^2$ and 2000 $mm^2$ The following parameters were kept the same for examples 6 to 8:
Cavity cross section shape: circular
Outlet nozzle width: 5 mm
Cavity distance 122 mm

| Example | | Cathode cavity ionized plasma species absorption ratio | Electron density ratio |
|---|---|---|---|
| 6 | 500 $mm^2$ | 1.54 | 2.05 |
| 7 | 1000 $mm^2$ (reference) | 1 | 1 |
| 8 | 2000 $mm^2$ | 0.61 | 0.71 |

Absorption of ionized plasma species on the cathode cavity and thus cavity sputtering and debris formation decrease when cavity cross section area is higher.

Electron density and thus process efficiency increases when cavity cross section area is lower.

At around 1000 mm² cavity cross section area a balanced level of absorption of ionized species and electron density is obtained.

Examples 9 to 13—Key Parameter: Cavity Distance

Five cavity distances were simulated: 168 mm, 142 mm, 114 mm, 104 mm, and 84 mm.

The following parameters were kept the same for examples 9 to 13:
Cavity cross section shape: circular
Cavity cross section area: 500 mm²
Outlet nozzle width: 5 mm

| Example | | Cathode cavity ionized plasma species absorption ratio | Electron density ratio |
|---|---|---|---|
| 9 | 168 mm | 0.12 | 0.35 |
| 10 | 142 mm | 0.68 | 0.97 |
| 11 | 114 mm | 0.89 | 0.97 |
| 12 | 104 mm (reference) | 1.00 | 1.00 |
| 13 | 84 mm | 2.38 | 1.18 |

Absorption of ionized plasma species on the cathode cavity and thus cavity sputtering and debris formation decreases when cavity distance is higher.

Electron density and thus process efficiency remains good for all cavity distances tested, except the highest. An interesting balance between both ratios is obtained between 100 mm and 145 mm cavity distance.

Examples 14 to 17—Key Parameter: Outlet Nozzle Width

Four nozzle widths were simulated: 5 mm, 10 mm, 20 mm, and 40 mm.

The following parameters were kept the same for examples 9 to 13:
Cavity cross section shape: circular
Cavity cross section area: 500 mm²
Cavity distance: 122 mm

| Example | | Cathode cavity ionized plasma species absorption ratio | Electron density ratio |
|---|---|---|---|
| 14 | 5 mm | 1.00 | 1.00 |
| 15 | 10 mm | 0.85 | 1.84 |
| 16 | 20 mm | 0.65 | 1.94 |
| 17 | 40 mm | 0.10 | 0.26 |

Absorption of ionized plasma species on the cathode cavity and thus cavity sputtering and debris formation decrease when the outlet nozzle width is larger.

Electron density and thus process efficiency increases when the outlet nozzle width is larger. At very high outlet nozzle width, for example at 40 mm, the pressure difference between the inside of the cavities and the vacuum chamber cannot be held at a sufficient level for maintaining a stable plasma, leading to a very low electron density level.

The invention claimed is:

1. A hollow cathode plasma source comprising a first electrode and a second electrode each electrode comprising an elongated cavity,
    wherein the electrodes extend substantially parallel to each other,
    wherein the first and second electrodes are both provided with a gas inlet for a plasma forming gas and with a gas outlet which leads to an outlet nozzle which is directed towards a substrate,
    wherein first and second electrodes are electrically connected to a power source supplying the electrodes with alternatingly opposing voltages, and
    wherein the following parameter's dimension are selected
        i. the cavity cross section is of rectangular, rounded rectangular or circular shape or of a shape intermediary of these shapes,
        ii. the cavity cross section area is comprised between 500 mm² and 4000 mm²,
        iii. the cavity distance is comprised between 85 mm and 160 mm, and
        iv. the outlet nozzle width is comprised between 1 mm and 25 mm.

2. The hollow cathode plasma source according to claim 1, wherein the cavity cross section shape is circular.

3. The hollow cathode plasma source according to claim 1, wherein the cavity cross section area is comprised between 500 mm² and 1000 mm².

4. The hollow cathode plasma source according to claim 1, wherein the cavity cross section area is comprised between 1000 mm² and 4000 mm².

5. The hollow cathode plasma source according to claim 1, wherein the cavity cross section area is comprised between 750 mm² and 1500 mm².

6. The hollow cathode plasma source according to claim 1, wherein the cavity distance is comprised between 100 mm and 145 mm.

7. The hollow cathode plasma source according to claim 1, wherein the outlet nozzle width is comprised between 3.5 mm and 25 mm.

* * * * *